(12) United States Patent
Kojima (10) Patent No.: US 7,148,688 B2
(45) Date of Patent: Dec. 12, 2006

(54) MAGNETIC RESONANCE IMAGING APPARATUS AND METHOD OF CONTROLLING MAGNETIC RESONANCE IMAGING APPARATUS

(75) Inventor: Fumitoshi Kojima, Otawara (JP)

(73) Assignees: Kabushiki Kaisha Toshiba, Tokyo (JP); Toshiba Medical Systems Corporation, Otawara (JP)

( * ) Notice: Subject to any disclaimer, the term of this patent is extended or adjusted under 35 U.S.C. 154(b) by 31 days.

(21) Appl. No.: 11/081,656

(22) Filed: Mar. 17, 2005

(65) Prior Publication Data

US 2005/0206379 A1 Sep. 22, 2005

(30) Foreign Application Priority Data

Mar. 17, 2004 (JP) ............................. 2004-076373
Feb. 14, 2005 (JP) ............................. 2005-036613

(51) Int. Cl.
*G01V 3/00* (2006.01)

(52) U.S. Cl. ..................................... 324/318; 324/309

(58) Field of Classification Search ................ 324/318, 324/319, 322, 309, 307, 300; 600/410, 423
See application file for complete search history.

(56) References Cited

U.S. PATENT DOCUMENTS 6,317,619 B1* 11/2001 Boernert et al. ............ 600/410
6,586,934 B1* 7/2003 Biglieri et al. .............. 324/309
6,744,251 B1* 6/2004 Taniguchi et al. .......... 324/318

FOREIGN PATENT DOCUMENTS

JP 5-269113 10/1993
JP 7-51248 2/1995
JP 2000-350701 12/2000

* cited by examiner

*Primary Examiner*—Brij B. Shrivastav
(74) *Attorney, Agent, or Firm*—Nixon & Vanderhye P.C.

(57) ABSTRACT

A magnetic resonance imaging apparatus includes a storage unit configured to store positional information about positional relationships between a first ROI and a reference image, and a ROI setting unit configured to set a second ROI to determine a position of a tomographic image based on the positional information.

23 Claims, 5 Drawing Sheets

MAGNETIC RESONANCE IMAGING APPARATUS AND METHOD OF CONTROLLING MAGNETIC RESONANCE IMAGING APPARATUS

CROSS-REFERENCE TO RELATED APPLICATIONS

This application is based upon and claims the benefit of priority from prior Japanese Patent Applications No. 2004-076373, filed Mar. 17, 2004; and No. 2005-036613, filed Feb. 14, 2005, the entire contents of both of which are incorporated herein by reference.

BACKGROUND OF THE INVENTION

1. Field of the Invention

The present invention relates to a magnetic resonance imaging apparatus having a user interface capable of easily determining a tomographic position and a method of controlling the same.

2. Description of the Related Art

A magnetic resonance imaging apparatus creates images of chemical and physical microscopic information of materials or observes a chemical shift spectrum by using a phenomenon in which a group of nucleuses having an inherent magnetic moment resonantly absorbs energies of a high frequency magnetic field rotating at a specific frequency when they are located in a uniform static magnetic field.

In a tomography using the magnetic resonance imaging apparatus, it is generally necessary to set various tomographic parameters (tomography sequence) such as, for example, TR, TE, a slice thickness, a size of FOV or the like. Since each tomographic parameter has an influence on the contrast of an image correlating with the other parameters, some technical knowledge or technologies and experiences are required to obtain images suitable for a diagnosis. In general, an operator performs another modality. For this reason, a period when the magnetic resonance imaging apparatus is not operated is generated, so that it is difficult for the operator to get used to the operation of the magnetic resonance imaging apparatus. As a result, there are cases that the operation time grows longer and the throughput of the work degrades.

In order to solve the above-mentioned problems, there are technologies called a simple tomography or PAS (programmable anatomical system). The simple tomography is a tomography method for beginners in which the beginners can relatively easily tomograph a MR image. In addition, the PAS is a function that can automatically preset tomographic parameters for each object part before scanning. By using these technologies, even engineers not having sufficient experiences can set suitable tomographic parameters to tomograph a suitable diagnosis image.

However, in the magnetic resonance imaging apparatuses in the related art, setting a position and an angle of a ROI (region of interest) has the following problems. Specifically, in the related art, most of the tomographic parameters can automatically be set by the PAS technology. However, the position and angle of the ROI cannot be automatically set. As a result, the operator subjectively determines and sets the position and angle of the ROI through the manual operation with a sufficient attention. At this time, a user interface setting the position and angle of the ROI from the positional relationships between an outline and an internal organ in a subject is used. However, there is a possibility that the unaccustomed user sets the ROI at the erroneous position and angle and tomographs it.

Furthermore, since the magnetic resonance imaging apparatus can tomograph all parts of the human body, a considerable training time is needed to master the flawless tomography technique. Therefore, in order to solve these problems through mastering the specialized knowledge or technology, a burden is large from a viewpoint of time, cost and management. In addition, from a medical point of view requiring an early diagnosis and therapy, the magnetic resonance imaging apparatus is not necessarily preferable.

BRIEF SUMMARY OF THE INVENTION

Accordingly, the present invention has been made to solve the above-mentioned problems, and it is an object of the present invention to provide a magnetic resonance imaging apparatus capable of automatically or semi-automatically setting a position and angle of a ROI substantially the same as a past image and a method of controlling the same.

In order to achieve the above-mentioned object, the present invention has the following units.

According to an aspect of the present invention, a magnetic resonance imaging apparatus for receiving a magnetic resonance signal generated from a subject by applying an gradient magnetic field and a high frequency to the subject arranged in a static magnetic field comprises a storage unit configured to store positional information which is information about relative positional relationships between a reference image and a first ROI set on the reference image, a ROI setting unit configured to set a second ROI on a positioning image based on the positional information, and a reconstruction unit configured to reconstruct a tomographic image based on the second ROI set on the positioning image.

According to another aspect of the present invention, a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises a storage unit configured to store a reference image in which a first ROI to determine a position of a tomographic image is set, a positional information generating unit configured to generate positional information which is information about positional relationships between the first ROI and the reference image, a ROI setting unit configured to set a second ROI on a positioning image, and a reconstruction unit configured to reconstruct a tomographic image based on the second ROI set on the positioning image.

According to another aspect of the present invention, a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises a storage unit configured to store positional information which is information about relative positional relationships between a plurality of past positioning images and a first ROI set for each of the plurality of past positioning images for determining a position of a tomographic image and which defines on what positional relationships the first ROI is set with respect to the corresponding past positioning image, for each past positioning image, a selecting unit configured to select from the plurality of positional information positional information serving as a reference for setting on the current positioning image a second ROI to determine a position of a tomographic image based on anatomical information of a current positioning image for the subject, and a ROI setting unit configured to set the second ROI on the current positioning image by using the selected reference positional information.

According to another aspect of the present invention, a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises a storage unit configured to store a plurality of past positioning images in which a first ROI to determine a position of a tomographic image is set, a selecting unit configured to select from the plurality of past positioning images a reference image serving as a reference for setting on the current positioning image a second ROI to determine a position of a tomographic image based on anatomical information of a current positioning image for the subject, a positional information generating unit configured to generate positional information defining on what positional relationships the first ROI is set with respect to the reference image, and a ROI setting unit configured to set on the current positioning image the second ROI to determine the position of the tomographic image based on the positional information.

According to another aspect of the present invention, a method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises setting a second ROI on a positioning image to determine a position of a tomographic image based on positional information which is information about relative positional relationships between a reference image and a first ROI set on the reference image for determining a position of a tomographic image, and obtaining a tomographic image of the subject by using the positioning image in which the second ROI is set.

According to another aspect of the present invention, a method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises generating positional information about positional relationships of a first ROI to determine a position of a tomographic image is set with respect to the reference image, and setting on a positioning image a second ROI to determine a position of a tomographic image based on the positional information.

According to another aspect of the present invention, a method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises storing in a storage unit positional information which is information about relative positional relationships between a plurality of past positioning images and a first ROI set for each of the plurality of past positioning images for determining a position of a tomographic image and which defines on what positional relationships the first ROI is set with respect to the corresponding past positioning image for each past positioning image, selecting from the plurality of positional information positional information serving as a reference for setting on the current positioning image a second ROI to determine a position of a tomographic image based on anatomical information of the current positioning image for the subject, and setting the second ROI on the current positioning image by using the selected reference positional information.

According to another aspect of the present invention, a method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal comprises storing in a storage unit a plurality of past positioning images in which a first ROI to determine a position of a tomographic image is set, selecting from the plurality of past positioning images a reference image serving as a reference for setting on a current positioning image a second ROI to determine a position of a tomographic image based on anatomical information of the current positioning image for the subject, generating positional information defining on what positional relationships the first ROI is set with respect to the reference image, and setting on the current positioning image the second ROI to determine the position of the tomographic image based on the positional information.

DETAILED DESCRIPTION OF THE INVENTION

Hereinafter, first and second embodiments of the present invention will be described with reference to the accompanying drawings. In the following description, elements having the same function and structure are denoted by the same reference numerals, and the repeated description is made only when it is necessary.

FIRST EMBODIMENT

Figure 1:
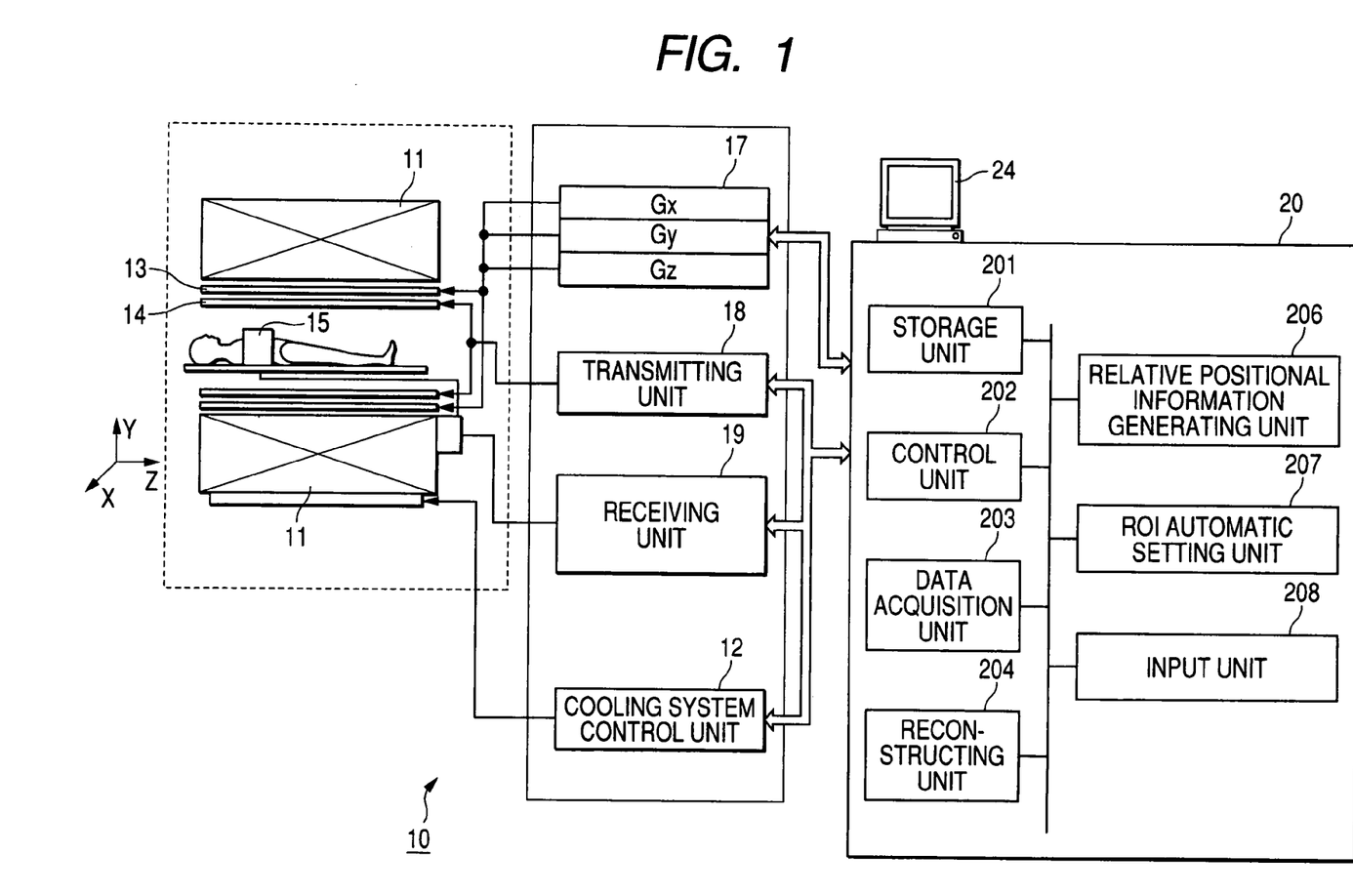
FIG. 1 is a block diagram showing the structure of a magnetic resonance imaging apparatus 10 according to a first embodiment of the present invention.

FIG. 1 is a block diagram showing the structure of a magnetic resonance imaging apparatus 10 according to a first embodiment of the present invention. As shown in FIG. 1, the magnetic resonance imaging apparatus 10 comprises a static magnetic field magnet 11, a cooling system control unit 12, an gradient magnetic field coil 13, a high frequency transmitting coil 14, a high frequency receiving coil 15, a transmitting unit 18, a receiving unit 19, a data processing unit 20 and a display unit 24.

The static magnetic field magnet 11 serves as a magnet for generating the static magnetic field and generates a uniform static magnetic field.

The cooling system control unit 12 controls a cooling mechanism of the static magnetic field magnet 11.

The gradient magnetic field coil 13 is provided at the inside of the static magnetic field magnet 11, and has an axis shorter than that of the static magnetic field magnet 11, and converts a pulse current supplied from an gradient magnetic field coil apparatus power supply 17 into the gradient magnetic field. A signal generating part (position) is specified through the gradient magnetic field generated by the gradient magnetic field coil 13.

In addition, a Z-axis direction is the same as a direction of the static magnetic field in the present embodiment. In the present embodiment, the gradient magnetic field coil 13 and the static magnetic field magnet 11 have a cylindrical shape respectively. In addition, the gradient magnetic field coil 13 is disposed in a vacuum by a predetermined supporting mechanism. This is to make the vibration of the gradient magnetic field coil 13 generated by the application of a pulse current not transmitted to the outside as a sound wave.

The high frequency transmitting coil (RF transmitting coil) 14 serves to apply a high frequency pulse for generating a magnetic resonance signal for a tomographic region of a subject to be examined. The high frequency transmitting coil 14 is a RF coil for the whole body. For example, when an abdomen is tomographed, the high frequency transmitting coil 14 can be also used as a receiving coil.

The high frequency receiving coil (RF receiving coil) 15 is disposed near the subject to be examined, preferably sandwiching the subject in it in a state in which the high frequency receiving coil adheres closely to the subject to receive the magnetic resonance from the subject. In general, the high frequency receiving coil 15 has an exclusive shape for each part.

In FIG. 1, a cross coil system having the high frequency transmitting coil and the high frequency receiving coil as separate elements is exemplified. However, a single coil system having one coil serving as the high frequency transmitting coil and the high frequency receiving coil may be adopted.

The gradient magnetic field coil apparatus power supply 17 generates a pulse current for forming the gradient magnetic field to supply it to the gradient magnetic field coil 13. In addition, the power supply of the gradient magnetic field coil apparatus 17 changes the direction of the pulse current supplied to the gradient magnetic field coil 13 to control a polarity of the gradient magnetic field according to the control of a control unit 202, which will be described in detail later.

The transmitting unit 18 includes an oscillating unit, a phase selecting unit, a frequency converting unit, an amplitude modulating unit and a high frequency power amplifying unit (they are not shown) and transmits a high frequency pulse corresponding to a Lamor frequency to a transmitting high frequency coil. The magnetization of a predetermined nucleus of the subject becomes an excited state by the high frequency generated from the high frequency transmitting coil 14 through the transmission of the high frequency pulse.

The receiving unit 19 includes an amplifying unit, an intermediate frequency converting unit, a phase detecting unit, a filter, and an A/D converter (they are not shown). The receiving unit 19 performs an amplifying process, an intermediate frequency converting process using a transmitting frequency, a phase detecting process, a filter process and an A/D converting process with respect to the magnetic resonance signal (high frequency signal) which is received from the high frequency coil 14 and which is emitted when the magnetization of the nucleus is alleviated from the excited state to the ground state.

The data processing unit 20 is a calculator system for processing the received data to generate a magnetic resonance image. The data processing unit 20 includes a storage unit 201, a control unit 202, a data acquisition unit 203, a reconstructing unit 204, a relative positional information generating unit 206, a ROI automatic setting unit 207 and an input unit 208.

The storage unit 201 is a memory for storing information about an angle and a position of the ROI (position information of ROI) set on an MR image obtained by the magnetic resonance imaging apparatus 10, a past positioning image (reference image) to be a reference for positioning the ROI of the positioning image in the tomography which is currently being carried out (current positioning image), and the corresponding reference image.

In addition, the reference image may be the magnetic resonance image previously tomographed by the magnetic resonance imaging apparatus 10 and may be the magnetic resonance image which is acquired through the removable media or network and which is tomographed by another apparatus.

The control unit 202 has a CPU, a memory or the like (not shown) and serves as the control center of the overall system to control the magnetic resonance imaging apparatus statically or dynamically.

The data acquisition unit 203 collects the digital signals sampled by the receiving unit 19.

The reconstructing unit 204 executes the after treatment, that is, the reconstruction such as a Fourier transform or the like with respect to the data collected by the data acquisition unit 203, and calculates image data or spectrum data of the desired nuclear spin in the subject.

The relative positional information generating unit 206 generates relative positional information between the reference image and the ROI position from the position information of the reference image and the ROI position thereof stored in the storage unit 201. Here, 'the relative positional information between the reference image and the ROI position' (hereinafter, simply referred as to 'reference position information') means positional information indicating on what positional relationships the ROI is set with respect to the surface of the subject, the internal organs, an outline of a bone and the positions of the internal organs extracted from the reference image. Therefore, the relative positional information generating unit 206 extracts anatomical information of the reference image (for example, the outline, the positions of the internal organs or the like) through a filtering process, an outline extracting process, a pattern matching process or the like. In addition, the relative positional information generating unit 206 calculates from the extracted anatomical information of the reference image how far and to what degrees of angle the corresponding ROI is set with respect to the outline or position of the predetermined organ, thereby calculating the reference positional information.

The automatic ROI setting unit 207 sets the ROI to the current positioning image such that the relative position between the reference image and the ROI thereof is substantially the same with respect to the positioning image (current positioning image) obtained through the tomographic operation which is currently being carried out, based on the reference positional information generated by the relative positional information generating unit 206.

Specifically, the automatic ROI setting unit 207 performs the filtering process, the outline extracting process and the pattern matching process with respect to the current positioning image to extract the anatomical information of the current positioning image (for example, the outline or internal organ position). The automatic ROI setting unit 207 sets the ROI on the current positioning image while referencing the extracted anatomical information of the current positioning image.

The input unit 208 has an input means for inputting various instructions, commands and information from an operator (a mouse or track ball, a mode changing switch, a keyboard or the like).

The display unit 24 is an output unit for displaying the spectrum data or image data inputted from the data processing unit 20. On the display unit 24, the current positioning image and the reference image in which the ROI is respectively set are simultaneously displayed such that they are parallel to each other or at least a part of them overlaps.

Operation of Tomography

Next, the operation of tomography of the magnetic resonance imaging apparatus 10 including the automatic setting process of the ROI will be described.

Figure 2:
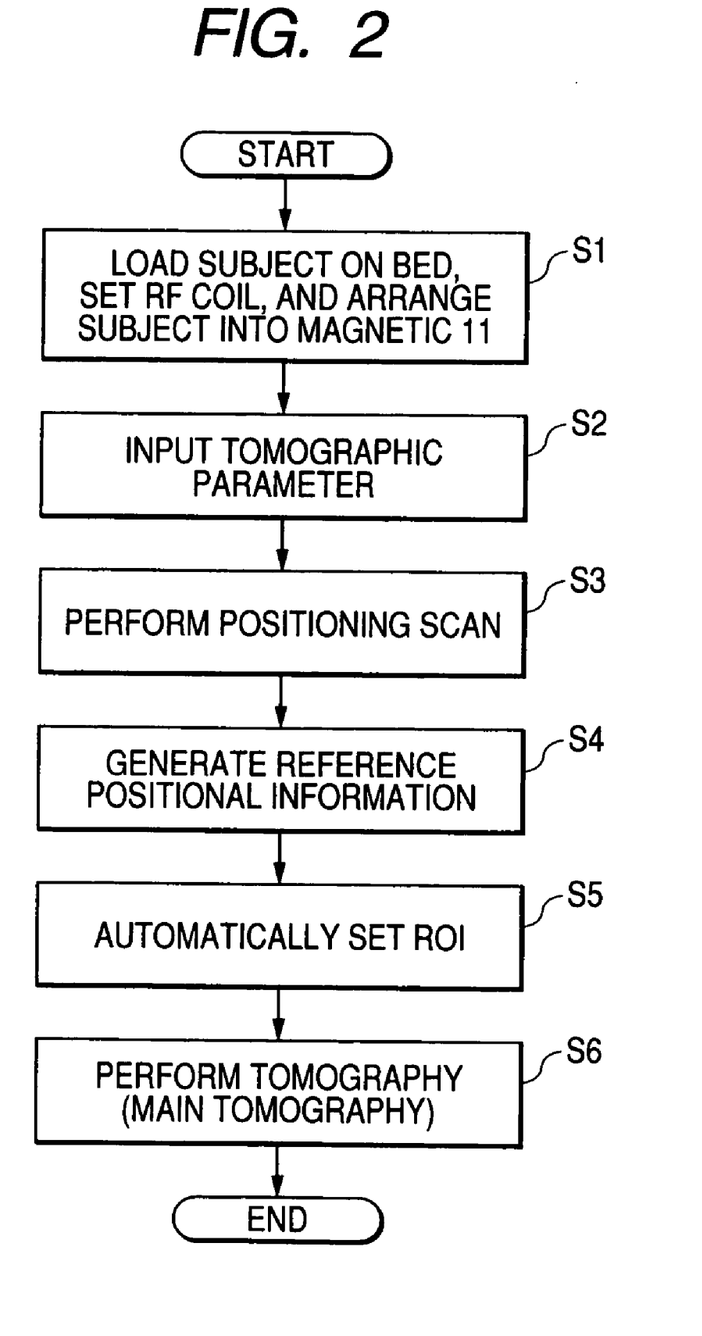
FIG. 2 is a flowchart showing a flow of the tomography operation of the magnetic resonance imaging apparatus 10 including the generation of reference position information and an automatic ROI setting.

FIG. 2 is a flowchart showing a flow of each process performed in the tomographic operation of the magnetic resonance imaging apparatus 10. As shown in FIG. 2, first, a patient is laid on a bed, the RF receiving coil 15 is set, and the static magnetic field magnet 11 is positioned according to the arrangement of the subject (step S1).

Next, predetermined tomographic parameters are inputted (step S2) and a positioning scan for acquiring the positioning image (pilot scan) is performed with respect to a predetermined region including a diagnosis part (step S3). In the magnetic resonance signal obtained by the corresponding positioning scan, the images which are reconstructed at the reconstructing unit 204 among the data collected by the data acquisition unit 203 and which are obtained by performing the development process are displayed on the display unit 24 as the positioning images and are stored in the storage unit 201.

Next, the relative positional information generating unit 206 generates the reference positional information from the position information of the reference image and the ROI thereof stored in the storage unit 201 (step S4).

Figure 3:
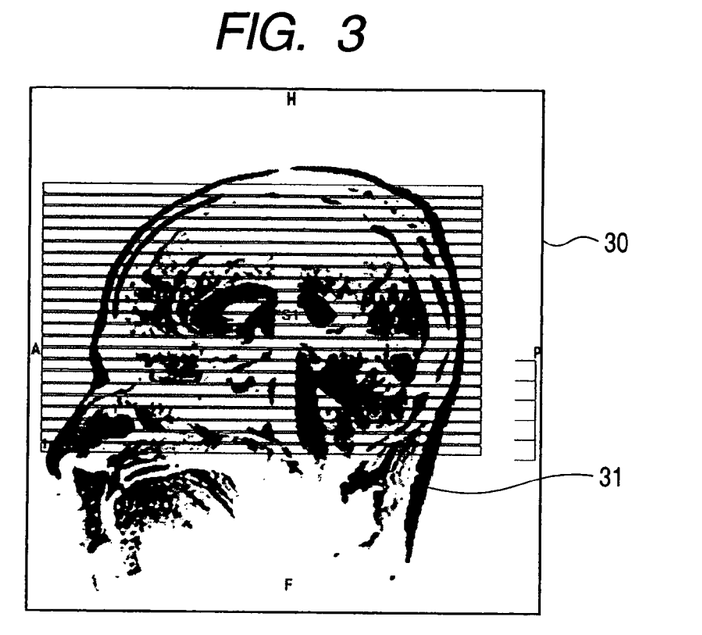
FIG. 3 is a diagram for describing a process of the reference position information generation and shows a reference image and a ROI set thereon.

FIG. 3 is a diagram for explaining the reference position information generating process in the step S4 and shows the reference image 30 and the ROI 31 set thereon. When the position information of the reference image 30 and the ROI 31 set on the corresponding reference image shown in FIG. 3 is used, first, the surface of the subject, the internal organ, the outline of the bone and the internal organ position in the reference image 30 are extracted. It is calculated from the extracted outline and position and the position and angle of the ROI 31 set on the image how far and to what degrees of angle the corresponding ROI 31 is set with respect to the outline or position of the predetermined organ, thereby generating the reference positional information.

Next, the automatic ROI setting unit 207 performs the automatic setting process of the ROI with respect to the current positioning image such that the relative position between the reference image and the ROI position thereof is substantially the same with respect to the current positioning image based on the reference positional information (step S5).

Figure 4:
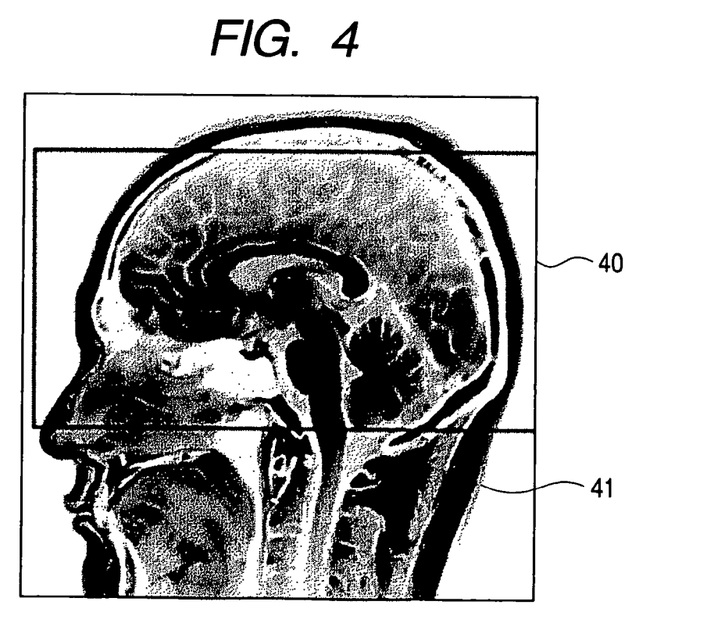
FIG. 4 is a diagram for describing a process of the automatic ROI setting and shows a current positioning image and a ROI set thereon.

FIG. 4 is a diagram for explaining the automatic setting process of the ROI in the step S5 and shows the current positioning image 40 and the ROI 41 set thereon. As shown in FIG. 4, the ROI automatic setting unit 207 extracts the internal organ position and the outline of the current positioning image 40 and automatically sets the ROI 41 on the current positioning image 40 such that the relative position between the reference image 30 and the ROI 31 thereof is substantially the same with respect to the current positioning image while referencing the extracted outline of the current positioning image and the reference position information.

Next, the tomography (main tomography) according to the tomographic parameters set in the step S2 is carried out with respect to the set ROI (step S6).

In addition, when different tomographic images are tomographed by deviating the tomographed positions, the processes of the steps S4 to S6 are repeated. The process of the step S4 may be carried out at a stage before the process of the step S3 and may be carried out parallel to the process of the step S5.

According to the above-mentioned configuration, when compared to the apparatus according to the related art, the following effects can be obtained.

According to the magnetic resonance imaging apparatus of the present invention, it is possible to automatically set the ROI to the current positioning image such that the positional relationships between the reference image and the ROI thereof are the same with respect to the current positioning image. Therefore, the operator can arbitrarily select the positioning image which is previously tomographed and can easily set the ROI having the same positional relationship as that of the ROI set on the corresponding image with respect to the current positioning image. As a result, although the operator is inexperienced in the operation of the magnetic resonance imaging apparatus, it is possible to set the ROI suitable for the positioning image easily and fast.

In addition, since the operator can confirm only through the visual observation whether the ROI of the reference image corresponds to the ROI of the current positioning image, the operator can easily understand the operation of the user interface with regard to the positioning in addition to alleviating the operation load. As a result, the magnetic resonance imaging apparatus according to the present invention can cope with the circumferences irrespective of the rotations of doctors in a hospital.

In addition, the above-mentioned automatic setting process of the ROI can be achieved through software. Specifically, the respective functions described in the embodiment can be achieved through the programs to enable the computer to execute predetermined functions. Further, it can be achieved by installing the corresponding program on the computer from a recording medium in which the programs are recorded and which can be read out by the computer. Therefore, the automatic setting process of the ROI can be achieved with a low cost.

Furthermore, the storage unit 201 may store the previously calculated reference position information if necessary. In this case, the relative positional information generating unit 206 is not indispensable and the system has the function corresponding to the automatic ROI setting unit 207, therefore the automatic setting process of the ROI can be achieved.

SECOND EMBODIMENT

Next, a second embodiment of the present invention will be described. When the past positioning images of which the ROI is set are plural, a magnetic resonance imaging apparatus according to the second embodiment selects a reference image from the plural positioning images to achieve the automatic setting process of the ROI. The selection of the reference image is performed based on anatomical information.

Figure 5:
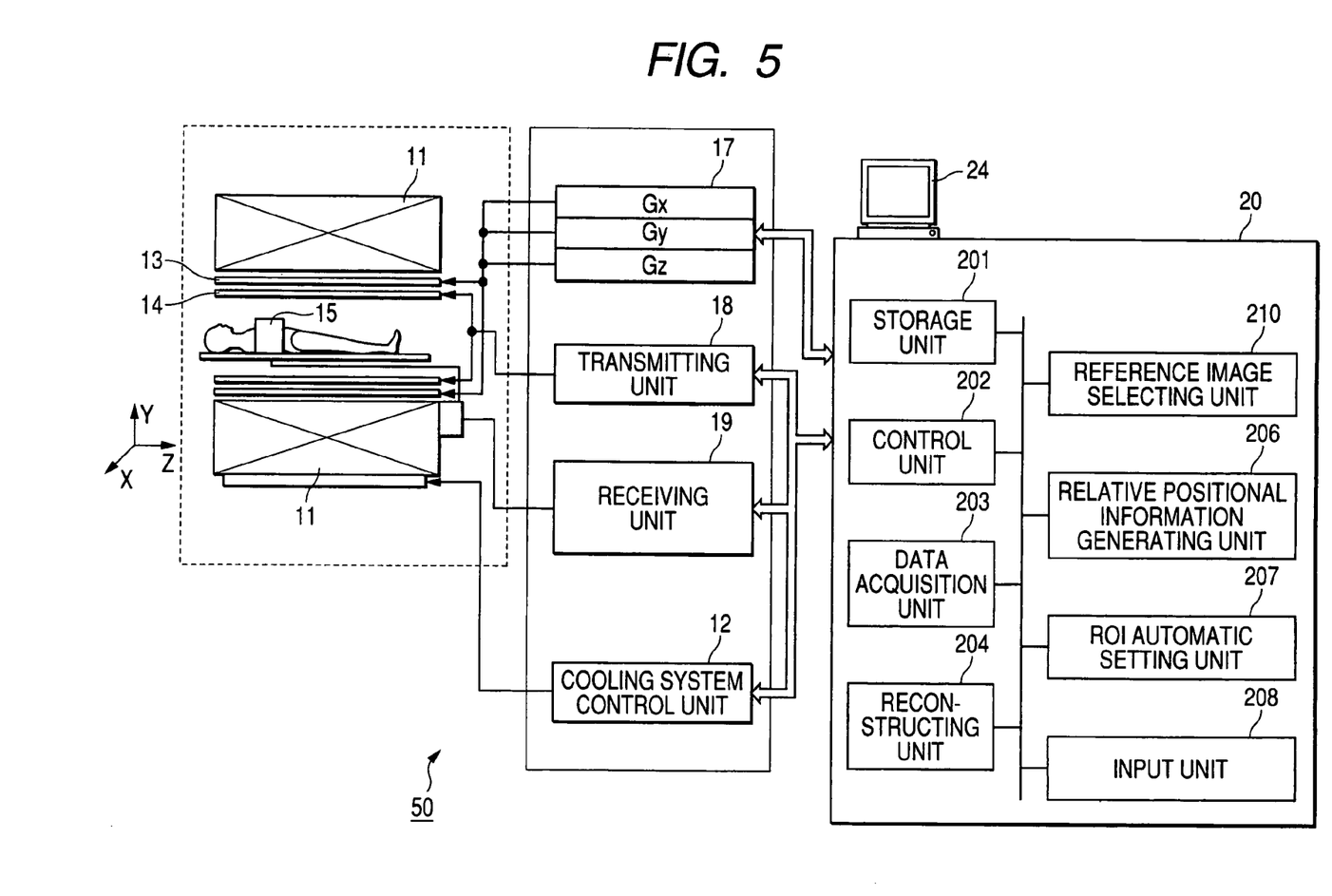
FIG. 5 is a block diagram showing the structure of a magnetic resonance imaging apparatus 50 according to a second embodiment of the present invention.

FIG. 5 is a block diagram showing the structure of the magnetic resonance imaging apparatus 50 according to the second embodiment. The difference between the structure of the magnetic resonance imaging apparatus 50 according to the second embodiment and the magnetic resonance imaging apparatus 10 according to the first embodiment shown in FIG. 1 will be described with reference to FIG. 5.

A storage unit 201 stores a plurality of past positioning images in which the ROI is previously set. Here, there is no limitation in the storage type. For example, the image in which the ROI is set may be stored as it is and each past positioning image and the positional information of the ROI for each image may be stored. In addition, each past positioning image and the reference positional information for each image may be stored.

A reference image selecting unit 210 compares the structures of the subjects between the current positioning image and each past positioning image in the storage unit 201 based on the anatomical information and selects as the reference image the closest past positioning image to the current positioning image. The anatomical information used in the selection is varied to the characteristics of the current positioning image (for example, what part is tomographed under what condition in what direction). For example, when the current positioning image is a front image of a head, the reference image selecting unit 210 selects the past positioning image (front image of a head) to which the corresponding reference is the most approximate the position (distance) of a nose to the very middle becomes the anatomical reference, and which anatomical information is used may be preset for each image characteristic and may be set through the manual operation by the operator in each time. In addition, the anatomical information can serve as topology information in the image from a viewpoint of the image recognition.

In addition, the reference image selecting unit 210 determines whether the past positioning image with regard to the same tomographic subject as the current positioning image exists in the storage unit 201, and when it is determined that the past positioning image does not exist, the reference image selecting unit 210 notifies the operator that the past positioning image that can be the reference image does not exist in the storage unit 201 through the display unit 24. The determination is performed based on the tomographic part inputted in the tomographic condition input step.

The relative positional information generating unit 206 generates the reference positional information of the reference image and the ROI position thereof from the position information of the reference image and the ROI thereof selected by the reference image selection unit 210. In addition, when the reference position information is stored, the relative positional information generating unit 206 selects the reference position information corresponding to the reference image selected by the reference image selecting unit 210.

The automatic ROI setting unit 207 sets the ROI to the current positioning image such that the relative positional relationships between the reference image and the ROI position thereof are substantially the same with respect to the current positioning image based on the reference image information generated by the relative positional information generating unit 206.

(Operation of Tomography)

Next, the operation of the tomography of the magnetic resonance imaging apparatus 50 including the selection process of the reference image will be described.

Figure 6:
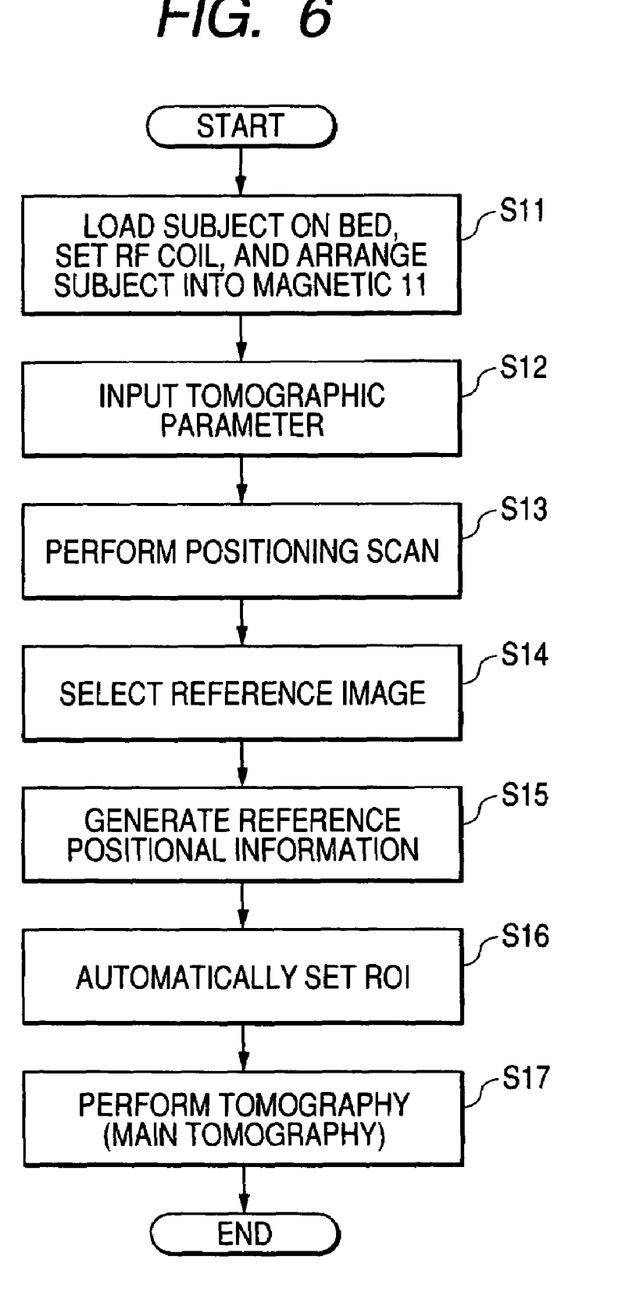
FIG. 6 is a flowchart showing a flow of each process carried out in a tomographic operation of the magnetic resonance imaging apparatus 50.

FIG. 6 is a flowchart showing a flow of each process carried out in the tomographic operation of the magnetic resonance imaging apparatus 50. In FIG. 6, the processes of steps S11 to S13 are substantially the same as those of the steps S1 to S3 shown in FIG. 2.

Next, the reference image selecting unit 210 selects the reference image from the plurality of past positioning images based on the anatomical information and the current positioning image obtained through the positioning scan (step S14).

Next, the relative positional information generating unit 206 generates the reference position information from the position information of the reference image and the ROI stored in the storage unit 201 (step S15). In addition, when the reference position information is already generated, the previously generated reference position information may be used as the reference position information.

Next, the automatic ROI setting unit 207 automatically sets the ROI with respect to the current positioning image such that the relative positional relationships between the reference image and the ROI position are substantially the same with respect to the current positioning image based on the reference positional information (step S16). The control unit 202 performs the tomography (main tomography) according to the tomographic parameters set in the step S2 with respect to the set ROI (step S17).

As described above, according to the magnetic resonance imaging apparatus of the present embodiment, the reference image is selected from the plurality of positioning images in which the ROI is set, and thus the automatic setting of the ROI is performed. Therefore, it is possible to use the past positioning image that is the most suitable for the current positioning image and to achieve the suitable ROI setting even when the individual difference of the subjects exists. As a result, it contributes to the improvement of the quality of the diagnosis.

In addition, the reference image selection for setting the ROI automatically is performed based on the anatomical information. Therefore, it is always possible to select the reference image with a high objectivity and thus to achieve the ROI setting not depending on the subjectivity of the operator.

The present invention is not limited to the above-mentioned embodiments and various changes and modifications can be made without departing from the spirit and scope of the present invention.

For example, in the above-mentioned embodiments, the reference image is basically the past magnetic resonance image obtained by the magnetic resonance imaging apparatus. However, using another modality, that is, the image obtained by the a multi slice CT or, the magnetic resonance image of the typical structure of the human body (standardized structure of the human body) or the animation image, the automatic setting of the ROI may be performed.

In the above-mentioned embodiments, using the anatomical information as the reference, the generation of the reference position information, the selection of the reference image and the setting of the ROI are performed. However, the present invention is not limited to the embodiments using the anatomical information as the reference and may use another reference. For example, in a static magnetic field space using the an isocenter (center of the coil) as an origin, the coordinates of the past positioning image, the coordinates of the ROI set in the corresponding image and the coordinates of the current positioning image are specified so that the reference position information may be created from the positional relationship between them.

In addition, the case using the head as the tomographic region is exemplified in the above-mentioned embodiments. However, the present invention is not limited thereto. The automatic setting function of the ROI is also effective with respect to the tomographic region (for example, the liver, the pelvis, the heart or the like) other than the head.

In addition, the ROI automatically set on the current positioning image according to each embodiment can be adjusted by changing and moving it through the manual operation using the input unit 208. For example, the cursor of a mouse is positioned on one side of the automatically set ROI 40 of the head shown in FIG. 4, and then clicked and dragged to a predetermined position. As a result, it is possible to shift the position of the side to the topside of the head. In addition, the relative position on the image of the ROI 40 can be changed with its shape maintained through the predetermined operation of the input unit 208.

By suitably combining the plurality of elements described in the above-mentioned embodiments, various inventions may be made. For example, some elements may be removed from the elements shown in the embodiments. In addition, elements of different embodiments may be suitably combined.

What is claimed is:

1. A magnetic resonance imaging apparatus for receiving a magnetic resonance signal generated from a subject by applying an gradient magnetic field and a high frequency to the subject arranged in a static magnetic field, comprising:
    a storage unit configured to store positional information which is information about relative positional relationships between a reference image and a first ROI set on the reference image;
    a ROI setting unit configured to set a second ROI on a positioning image based on the positional information; and
    a reconstruction unit configured to reconstruct a tomographic image based on the second ROI set on the positioning image.

2. The magnetic resonance imaging apparatus according to claim 1,
    wherein the ROI setting unit is configured to set the second ROI with respect to the tomographic image based on anatomical information including at least one of an outline of a body surface, an outline of a bone, an outline of a soft tissue, a position of a bone and a position of a soft tissue in the subject.

3. The magnetic resonance imaging apparatus according to claim 1, further comprising:
    an input unit configured to input an instruction changing and moving the set ROI,
    wherein the ROI setting unit changes or moves the second ROI based on the inputted instruction.

4. A magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:
    a storage unit configured to store a reference image in which a first ROI to determine a position of a tomographic image is set;
    a positional information generating unit configured to generate positional information which is information about positional relationships between the first ROI and the reference image;
    a ROI setting unit configured to set a second ROI on a positioning image; and
    a reconstruction unit configured to reconstruct a tomographic image based on the second ROI set on the positioning image.

5. The magnetic resonance imaging apparatus according to claim 4,
    wherein the positional information generating unit extracts anatomical information including at least one among an outline of a body surface, an outline of a predetermined bone, an outline of a predetermined soft tissue, a position of a predetermined bone and a position of the predetermined soft tissue in the subject imaged on the reference image and generates the positional information based on the anatomical information of the reference image, and
    the ROI setting unit extracts anatomical information including at least one among an outline of a body surface, an outline of a predetermined bone, an outline of a predetermined soft tissue, a position of a predetermined bone and a position of the predetermined soft tissue in the subject imaged on the tomographic image and sets the second ROI with respect to the tomographic image based on the anatomical information of the tomographic image.

6. The magnetic resonance imaging apparatus according to claim 4, further comprising:
    a display unit configured to display the reference image in which the first ROI is set and the positioning image in which the second ROI is set such that the first and the second ROIs are arranged parallel to each other or at least a part of the first ROI overlaps on a part of the second ROI.

7. The magnetic resonance imaging apparatus according to claim 4,
    wherein the reference image is an image which is previously obtained by the magnetic resonance imaging apparatus.

8. The magnetic resonance imaging apparatus according to claim 4, further comprising:
    an input unit configured to input an instruction changing and moving the set second ROI,
    wherein the ROI setting unit changes or moves the set second ROI based on the inputted instruction.

9. A magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:
    a storage unit configured to store positional information which is information about relative positional relationships between a plurality of past positioning images and a first ROI set for each of the plurality of past positioning images for determining a position of a tomographic image and which defines on what positional relationships the first ROI is set with respect to the corresponding past positioning image, for each past positioning image;

a selecting unit configured to select from the plurality of positional information positional information serving as a reference for setting on the current positioning image a second ROI to determine a position of a tomographic image based on anatomical information of a current positioning image for the subject; and a ROI setting unit configured to set the second ROI on the current positioning image by using the selected reference positional information.

10. The magnetic resonance imaging apparatus according to claim 9, wherein the selecting unit determines whether the past positioning image for the same tomographic subject as the current positioning image is in the storage unit or not, the selection unit notifies that the past positioning image serving as a reference image does not exist when it is determined that the past positioning image for the same tomographic subject as the current positioning image is not in the storage unit, and the selection unit executes the selection when it is determined that the past positioning image for the same tomographic subject as the current positioning image is in the storage unit.

11. The magnetic resonance imaging apparatus according to claim 9, further comprising:

an input unit configured to inputting an instruction changing and moving the set second ROI, wherein the ROI setting unit changes or moves the set second ROI based on the inputted instruction.

12. The magnetic resonance imaging apparatus according to claim 9, wherein the ROI setting unit extracts anatomical information including at least one among an outline of a body surface, an outline of a predetermined bone, an outline of a soft tissue, a position of a bone and a position of the soft tissue in the subject imaged on the current positioning image and sets the second ROI with respect to the current positioning image based on the anatomical information.

13. A magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:

a storage unit configured to store a plurality of past positioning images in which a first ROI to determine a position of a tomographic image is set;

a selecting unit configured to select from the plurality of past positioning images a reference image serving as a reference for setting on the current positioning image a second ROI to determine a position of a tomographic image based on anatomical information of a current positioning image for the subject;

a positional information generating unit configured to generate positional information defining on what positional relationships the first ROI is set with respect to the reference image; and a ROI setting unit configured to set on the current positioning image the second ROI to determine the position of the tomographic image based on the positional information.

14. The magnetic resonance imaging apparatus according to claim 13, wherein the selecting unit determines whether the past positioning image for the same tomographic subject as the current positioning image is in the storage unit or not, the selection unit notifies that the past positioning image serving as a reference image does not exist when it is determined that the past positioning image for the same tomographic subject as the current positioning image is not in the storage unit, and the selection unit executes the selection when it is determined that the past positioning image for the same tomographic subject as the current positioning image is in the storage unit.

15. The magnetic resonance imaging apparatus according to claim 13, further comprising:

an input unit configured to input an instruction changing and moving the set second ROI, wherein the ROI setting unit changes or moves the set second ROI based on the inputted instruction.

16. The magnetic resonance imaging apparatus according to claim 13, wherein the selecting unit extracts anatomical information including at least one among an outline of a body surface, an outline of a bone, an outline of a soft tissue, a position of a bone and a position of the soft tissue in the subject imaged on the current positioning image and selects the reference image based on the anatomical information of the reference image.

17. The magnetic resonance imaging apparatus according to claim 13, wherein the positional information generating unit extracts anatomical information including at least one among an outline of a body surface, an outline of a bone, an outline of a soft tissue, a position of a bone and a position of the soft tissue in the subject imaged on the reference image and generates the positional information based on the anatomical information of the reference image, and the ROI setting unit extracts anatomical information including at least one among an outline of a body surface, an outline of a bone, an outline of a soft tissue, a position of a bone and a position of the soft tissue in the subject imaged on the current positioning image and sets the second ROI with respect to the current positioning image based on the anatomical information.

18. The magnetic resonance imaging apparatus according to claim 17, further comprising:

a display unit configured to display the reference image in which the first ROI is set and the current positioning image in which the second ROI is set such that they are arranged parallel to each other or at least a part of them overlaps.

19. The magnetic resonance imaging apparatus according to claim 17, wherein the reference image is an image which is previously obtained by the magnetic resonance imaging apparatus.

20. A method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:

setting a second ROI on a positioning image to determine a position of a tomographic image based on positional information which is information about relative positional relationships between a reference image and a first ROI set on the reference image for determining a position of a tomographic image; and obtaining a tomographic image of the subject by using the positioning image in which the second ROI is set.

21. A method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:

generating positional information about positional relationships of a first ROI to determine a position of a tomographic image is set with respect to the reference image; and setting on a positioning image a second ROI to determine a position of a tomographic image based on the positional information.

22. A method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:

storing in a storage unit positional information which is information about relative positional relationships between a plurality of past positioning images and a first ROI set for each of the plurality of past positioning images for determining a position of a tomographic image and which defines on what positional relationships the first ROI is set with respect to the corresponding past positioning image for each past positioning image;

selecting from the plurality of positional information positional information serving as a reference for setting on the current positioning image a second ROI to determine a position of a tomographic image based on anatomical information of the current positioning image for the subject; and setting the second ROI on the current positioning image by using the selected reference positional information.

23. A method of controlling a magnetic resonance imaging apparatus for receiving a magnetic resonance signal generated from a subject by applying an gradient magnetic field and a high frequency to the subject arranged in a static magnetic field and generating a tomographic image by using the magnetic resonance signal, comprising:

storing in a storage unit a plurality of past positioning images in which a first ROI to determine a position of a tomographic image is set;

selecting from the plurality of past positioning images a reference image serving as a reference for setting on a current positioning image a second ROI to determine a position of a tomographic image based on anatomical information of the current positioning image for the subject;

generating positional information defining on what positional relationships the first ROI is set with respect to the reference image; and setting on the current positioning image the second ROI to determine the position of the tomographic image based on the positional information.

* * * * *